(12) United States Patent
Vega et al.

(10) Patent No.: US 11,189,786 B2
(45) Date of Patent: Nov. 30, 2021

(54) TAPERED RESISTIVE MEMORY WITH INTERFACE DIPOLES

(71) Applicant: International Business Machines Corporation, Armonk, NY (US)

(72) Inventors: Reinaldo Vega, Mahopac, NY (US); Takashi Ando, Eastchester, NY (US); Jianshi Tang, Beijing (CN); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 16/587,543

(22) Filed: Sep. 30, 2019

(65) Prior Publication Data
US 2021/0098698 A1 Apr. 1, 2021

(51) Int. Cl.
*H01L 45/00* (2006.01)
(52) U.S. Cl.
CPC ...... *H01L 45/1233* (2013.01); *H01L 45/1253* (2013.01); *H01L 45/1675* (2013.01); *H01L 45/08* (2013.01); *H01L 45/146* (2013.01); *H01L 45/147* (2013.01)
(58) Field of Classification Search
None
See application file for complete search history.

(56) References Cited

U.S. PATENT DOCUMENTS

| | | | |
|---|---|---|---|
| 7,786,461 B2 | 8/2010 | Lung | |
| 8,129,250 B2 | 3/2012 | Rossel et al. | |
| 8,189,374 B2 | 5/2012 | Zaidi | |
| 8,345,463 B2 * | 1/2013 | Lee | H01L 45/145 365/148 |
| 8,853,713 B2 | 10/2014 | Marsh et al. | |
| 9,153,779 B2 | 10/2015 | Ariga et al. | |
| 9,543,511 B2 | 1/2017 | Sung et al. | |
| 2015/0325695 A1 | 11/2015 | Suh et al. | |
| 2020/0343448 A1 | 10/2020 | Ando et al. | |
| 2021/0119122 A1 | 4/2021 | Ando et al. | |

OTHER PUBLICATIONS

Hsin Wei Pan et al., "1Kbit FinFET Dielectric (FIND) RRAM in Pure 16nm FinFET CMOS Logic Process," International Electron Devices Meeting (IEDM), Dec. 2015, 10.5, (4 pages).
H. Jagannathan et al., "Engineering High Dielectric Constant Materials for Band-Edge CMOS Applications," ECS Transactions, vol. 16, No. 5, Oct. 2008, pp. 19-26.

* cited by examiner

*Primary Examiner* — Robert K Carpenter
(74) *Attorney, Agent, or Firm* — Randall Bluestone; Michael J. Chang, LLC (57) ABSTRACT

Tapered resistive memory devices with interface dipoles are provided. In one aspect, a ReRAM device includes: a bottom electrode; a core dielectric that is thermally conductive disposed on the bottom electrode; an oxide resistive memory cell disposed along outer sidewalls of the core dielectric, wherein the oxide resistive memory cell has inner edges adjacent to the core dielectric, and outer edges that are tapered; an outer coating disposed adjacent to the outer edges of the oxide resistive memory cell; and a top electrode disposed on the core dielectric, the oxide resistive memory cell, and the outer coating. A method of forming a ReRAM device as well as a method of operating a ReRAM device are also provided.

13 Claims, 9 Drawing Sheets

FIG. 11A (following from FIG. 11)

FIG. 12

(following from FIG. 11A)

TAPERED RESISTIVE MEMORY WITH INTERFACE DIPOLES

FIELD OF THE INVENTION

The present invention relates to resistive memory devices, and more particularly, to tapered resistive memory devices with interface dipoles for controlled filament formation and reduced joule heating.

BACKGROUND OF THE INVENTION

Resistive random-access memory (ReRAM) is a type of non-volatile memory. ReRAM cells store information based on a resistance across a dielectric element. The dielectric is typically insulating. However, an applied voltage to the ReRAM cell can be used to form (electroform) an electrically-conductive path or filament through the dielectric element.

During a RESET operation, the filament is broken/ruptured thereby increasing the cell resistance. During a SET operation, an applied voltage can again be used to re-form the filament and decrease the cell resistance.

However, electroformed filaments have random placement in ReRAM cells, which leads to higher variability and higher forming voltage. Further, SET programming tends to be abrupt due to Joule heating (i.e., resistive heating) which accelerates filament formation.

Therefore, improved ReRAM designs having more localized/uniform filament formation as well as reduced Joule heating would be desirable.

SUMMARY OF THE INVENTION

The present invention provides tapered resistive memory devices with interface dipoles for controlled filament formation and reduced joule heating. In one aspect of the invention, a resistive random-access memory (ReRAM) device is provided. The ReRAM device includes: a bottom electrode; a core dielectric that is thermally conductive disposed on the bottom electrode; an oxide resistive memory cell disposed along outer sidewalls of the core dielectric, wherein the oxide resistive memory cell has inner edges adjacent to the core dielectric, and outer edges that are tapered; an outer coating disposed adjacent to the outer edges of the oxide resistive memory cell; and a top electrode disposed on the core dielectric, the oxide resistive memory cell, and the outer coating.

In another aspect of the invention, a method of forming a ReRAM device is provided. The method includes: forming a bottom electrode on a substrate; forming a core dielectric that is thermally conductive on the bottom electrode; depositing a memory cell oxide layer over the bottom electrode and the core dielectric; patterning the memory cell oxide layer into an oxide resistive memory cell along outer sidewalls of the core dielectric, wherein the oxide resistive memory cell has inner edges adjacent to the core dielectric, and outer edges that are tapered; forming an outer coating adjacent to the outer edges of the oxide resistive memory cell; and forming a top electrode on the core dielectric, the oxide resistive memory cell, and the outer coating.

In yet another aspect of the invention, a method of operating a ReRAM device is provided. The method includes: providing the ReRAM device having a bottom electrode, a core dielectric that is thermally conductive disposed on the bottom electrode; an oxide resistive memory cell disposed along outer sidewalls of the core dielectric, wherein the oxide resistive memory cell has inner edges adjacent to the core dielectric, and outer edges that are tapered, an outer coating disposed adjacent to the outer edges of the oxide resistive memory cell, and a top electrode disposed on the core dielectric, the oxide resistive memory cell, and the outer coating; applying a positive bias to the bottom electrode to form filaments in the oxide resistive memory cell, whereby the outer edges of the oxide resistive memory cell that are tapered geometrically constrain formation of the filaments toward the inner edges of the oxide resistive memory cell; and applying a negative bias to the bottom electrode to break the filaments.

A more complete understanding of the present invention, as well as further features and advantages of the present invention, will be obtained by reference to the following detailed description and drawings.

DETAILED DESCRIPTION OF PREFERRED EMBODIMENTS

Provided herein are resistive random-access memory (ReRAM) cell designs and techniques for formation thereof which enable localized flux redistribution through a combination of filament geometry and interface dipole formation. Advantageously, the net effect is more localized/uniform filament formation as well as reduced Joule heating (less abrupt, more linear SET programming).

Namely, as will be described in detail below, the present ReRAM cell designs employ a combination of tapered geometry and interface dipole pointing away from the cell to reduce flux density at the bottom of the cell. This results in the highest field region existing only toward the inner surface, thus preferentially forming filaments in this region. See, for example, FIG. 1.

Figure 1:
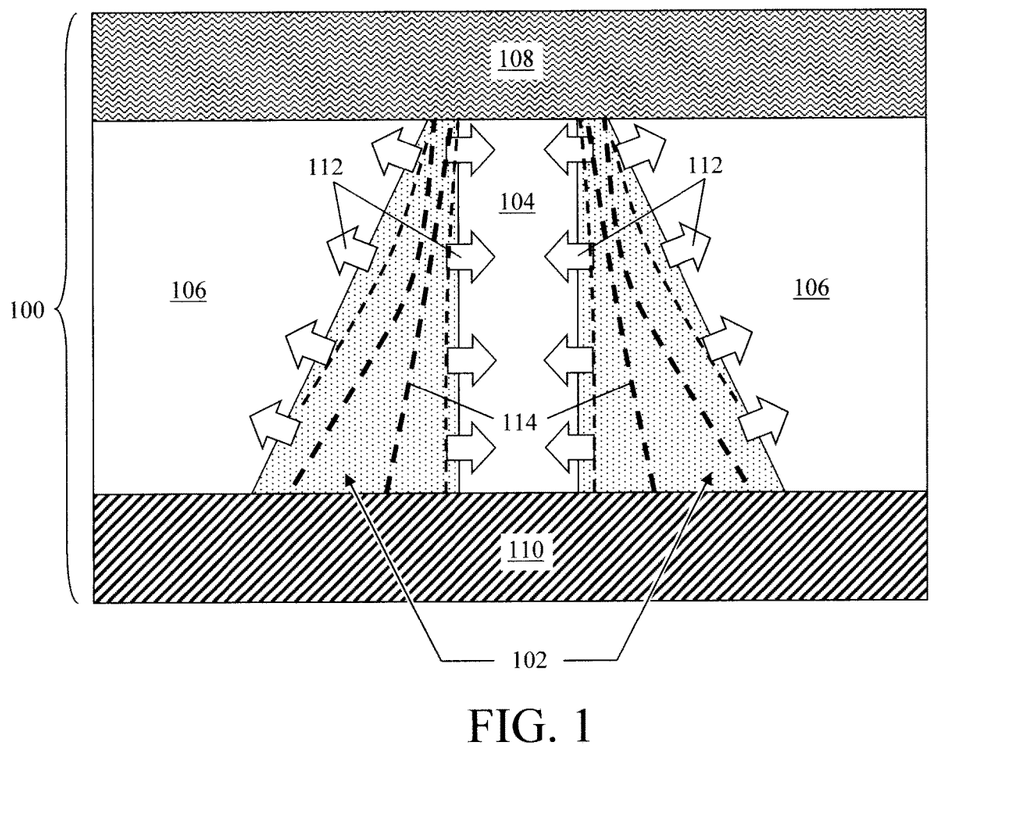
FIG. 1 is a cross-sectional diagram illustrating an exemplary resistive random-access memory (ReRAM) device with a tapered oxide resistive memory cell and interfacial dipole according to an embodiment of the present invention.

As shown in FIG. 1, according to an exemplary embodiment, a ReRAM device 100 includes an oxide resistive memory cell 102 disposed along outer sidewalls of a thermally conductive, high group electronegativity (Gp) core dielectric 104, whereby the inner edges of the oxide resistive memory cell 102 are adjacent to the high Gp core dielectric 104. As shown in FIG. 1, at least one edge of the oxide resistive memory cell 102 has a tapered angle. By way of example only, in this particular example the outer edges of oxide resistive memory cell 102 have a tapered angle, while the inner edges are vertical. An outer coating 106 is disposed adjacent to the outer edges of the oxide resistive element 102.

Oxide resistive memory cell 102/high Gp core dielectric 104/outer coating 106 are present between a top electrode 108 (above the cell) and a bottom electrode 110 (below the cell). According to an exemplary embodiment, top electrode 108 is formed from an inert metal including, but not limited to, titanium nitride (TiN) having a Ti/N ratio of less than or equal to ($\leq$) 1, tantalum nitride (TaN), tungsten (W) and/or noble metals such as platinum (Pt), iridium (Ir) and/or ruthenium (Ru). According to an exemplary embodiment, bottom electrode 110 is formed from a reactive (oxidizable) metal including, but not limited to, TiN having a Ti/N ratio of greater than ($>$) 1, Ti-containing alloys (such as TiN and/or tungsten titanium (TiW)) and/or aluminum (Al)-containing alloys (such as titanium aluminum carbide (TiAlC)). As will be described in detail below, when a positive bias is applied to the bottom electrode 110, ions from bottom electrode 110 migrate through the oxide resistive memory cell 102 toward the top electrode 108 forming electrically-conductive filaments in oxide resistive memory cell 102, decreasing the cell resistance. This is also referred to herein as a SET process. Reversing the bias causes the filament to break or rupture, increasing the cell resistance. This is also referred to herein as a RESET process.

According to an exemplary embodiment, oxide resistive memory cell 102 is formed from a low Gp dielectric. Suitable low Gp dielectric materials include, but are not limited to, hafnium oxide ($HfO_2$), lanthanum oxide ($LaO_2$) and/or strontium titanate ($SrTiO_3$). Outer coating 106 can be formed from the same high Gp dielectric as core 104. Suitable high Gp dielectric materials include, but are not limited to, titanium oxide ($TiO_2$) and/or aluminum oxide ($AlO_2$).

Figure 3:
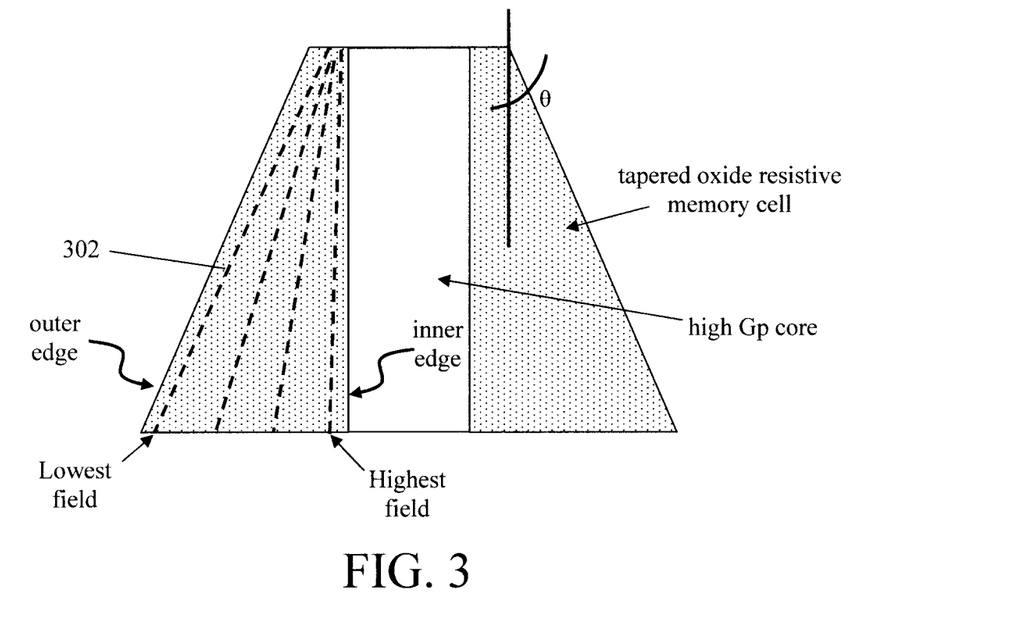
FIG. 3 is a diagram illustrating how a tapered oxide resistive memory cell design reduces the electric field toward the outer portion of the cell by a factor of $\cos(\theta)$ according to an embodiment of the present invention.

As indicated by arrows 112 in FIG. 1, this use of a low Gp dielectric for oxide resistive memory cell 102 and a high Gp dielectric for core 104/outer coating 106 results in an interface dipole pointing away from the cell. As shown by arrows 112, the direction of the interface dipoles is from the low Gp dielectric to the high Gp dielectric. That combined with the tapered geometry of oxide resistive memory cell 102 reduces a flux density at the bottom of the cell. See flux lines 114. This results in the highest field region existing only toward the inner edges of the oxide resistive memory cell 102 (see, e.g., FIGS. 3-5, described below), thus preferentially forming filaments in this region. Closer proximity to the thermally conductive core 104 also reduces Joule heating.

Tapering the oxide resistive memory cell 102 reduces the contact area at the top of the cell. In order to increase the contact area between oxide resistive memory cell 102 and top electrode 108, embodiments are contemplated herein where the top electrode 108 wraps around the (narrow) top region of the cell. See, for example, ReRAM device 200 of FIG. 2.

Figure 2:
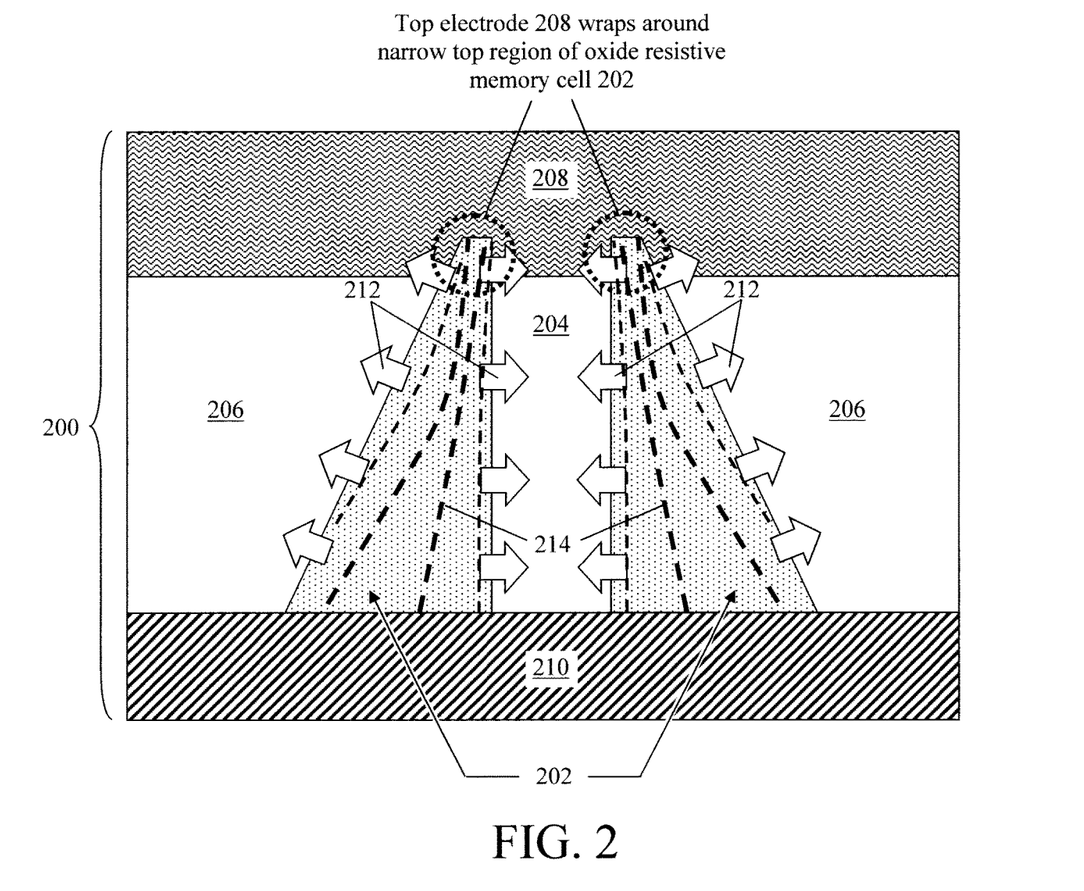
FIG. 2 is a cross-sectional diagram illustrating an exemplary ReRAM device with a tapered oxide resistive memory cell and interfacial dipole and a top electrode that wraps around a top portion of the oxide resistive memory cell according to an embodiment of the present invention.

In the same manner as the previous embodiment of FIG. 1, ReRAM device 200 also includes a (low Gp) oxide resistive memory cell 202 disposed along outer sidewalls of a thermally conductive, high Gp core dielectric 204, whereby the inner edges of the oxide resistive memory cell 202 are adjacent to the high Gp core dielectric 204. As shown in FIG. 2, at least one edge of the oxide resistive memory cell 202 has a tapered angle. By way of example only, in this particular example the outer edges of oxide resistive memory cell 202 have a tapered angle, while the inner edges are vertical. A (high Gp oxide) outer coating 206 is disposed adjacent to the outer edges of the oxide resistive element 202. Oxide resistive memory cell 202/high Gp core dielectric 204/outer coating 206 are present between (inert electrode) top and (reactive metal) bottom electrodes 208 and 210, respectively. Suitable low Gp/high Gp oxide and inert/reactive electrode metals were provided above.

As above, the use of a low Gp dielectric for oxide resistive memory cell 202 and a high Gp dielectric for core 204/outer coating 206 results in an interface dipole pointing away from the cell. See arrows 212. That orientation of the interface dipole combined with the tapered geometry of oxide resistive memory cell 202 reduces a flux density at the bottom of the cell. See flux lines 214. This results in the highest field region existing only toward the inner edges of the oxide resistive memory cell 202 (see, e.g., FIGS. 3-5, described below), thus preferentially forming filaments in this region. Closer proximity to the thermally conductive core 204 also reduces Joule heating.

In this exemplary embodiment, the top electrode 208 wraps around the tapered top of the oxide resistive memory cell 202. See FIG. 2. Namely, in the previous example shown in FIG. 1, the (narrow) top of oxide resistive memory cell 102 is essentially coplanar with the top surface of outer coating 106. Thus, the top electrode 108 only contacts the top of oxide resistive memory cell 102. By comparison, in ReRAM device 200 of FIG. 2, a top portion of oxide resistive memory cell 202 extends out from outer coating 206. Thus, the top electrode 208 wraps around that exposed top portion of oxide resistive memory cell 202, i.e., the top electrode 208 contacts a top surface of oxide resistive memory cell 202 as well as the sidewalls of the portion of oxide resistive memory cell 202 extending out from the outer coating 206. Advantageously, doing so increases the contact area between oxide resistive memory cell 202 and top electrode 208.

Use of the present tapered ReRAM cell design reduces the electric field toward the outer portion of the cell by a factor of $\cos(\theta)$. See FIG. 3. This tapered design reduces the flux density at the bottom of the oxide resistive memory cell. As shown by flux lines 302, the tapered design geometrically constrains the highest electric fields toward the inner edge, i.e., edge of the oxide resistive memory cell immediately adjacent to the high Gp core—see FIG. 3. To use a non-limiting, illustrative example: if $\theta=45°$, then the electric field along the outer edge is 0.707× the field along the inner edge.

Figure 4:
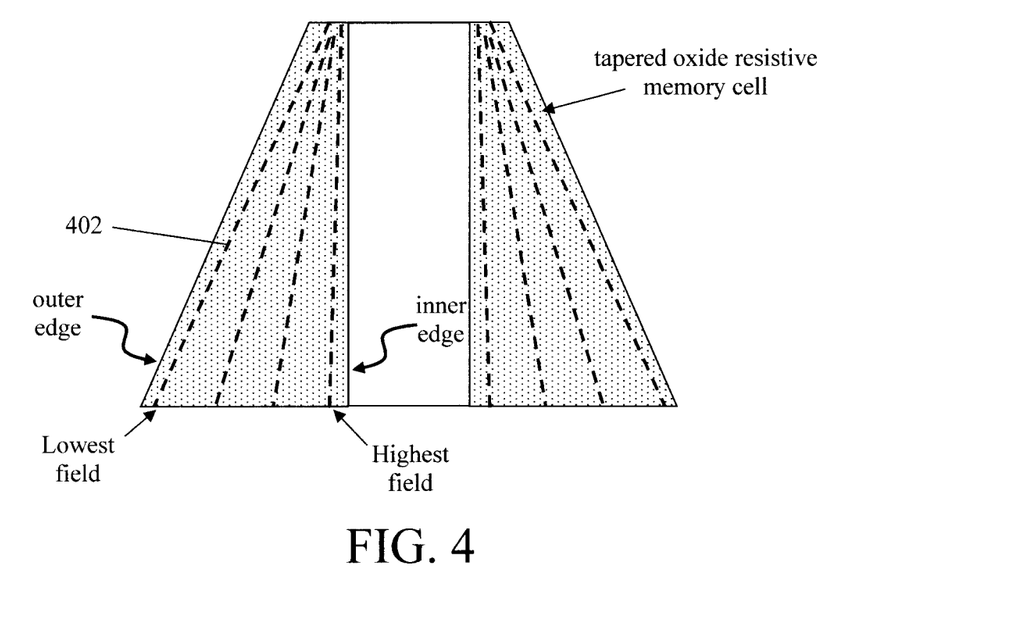
FIG. 4 is a diagram illustrating a flux density of the present tapered oxide resistive memory cell design without an interfacial dipole according to an embodiment of the present invention.
Figure 5:
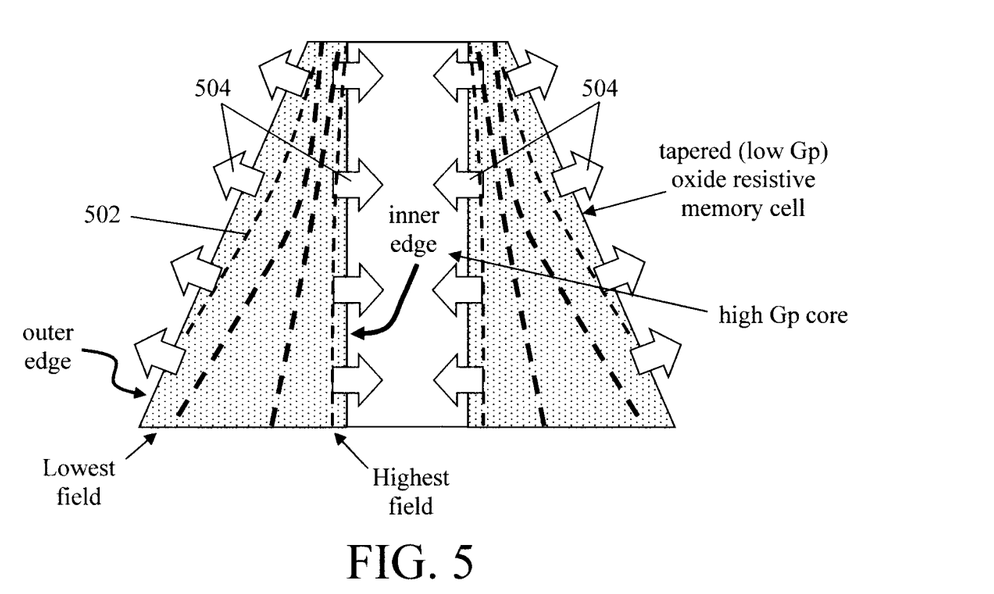
FIG. 5 is a diagram illustrating a flux density of the present tapered oxide resistive memory cell design with an interfacial dipole according to an embodiment of the present invention.

Also, introducing an interfacial dipole at the inner and outer edges of the oxide resistive memory cell further dilutes flux density at the bottom of the cell, thus further constraining the highest field regions toward the inner edges. See, for example, FIGS. 4 and 5. Namely, flux lines 402 in FIG. 4 illustrate what the flux density of the present tapered ReRAM cell design would be without an interfacial dipole, and flux lines 502 in FIG. 5 illustrate what the flux density of the present tapered ReRAM cell design is with an interfacial dipole (indicated by arrows 504). By constraining the highest field regions toward the inner edges of the cell, the filament also preferentially forms towards the inner edges of the cell. By comparison, in conventional ReRAM designs the filaments have random placement which leads to higher variability and higher forming voltage.

Advantageously, preferential filament formation toward the inner edges of the oxide resistive memory cell places more filaments closer to the high Gp core which has higher thermal conductivity than the (low Gp) dielectric of the oxide resistive memory cell. Closer proximity of the filaments to the thermally conductive core reduces Joule heating, resulting in less abrupt SET programming.

Figure 6:
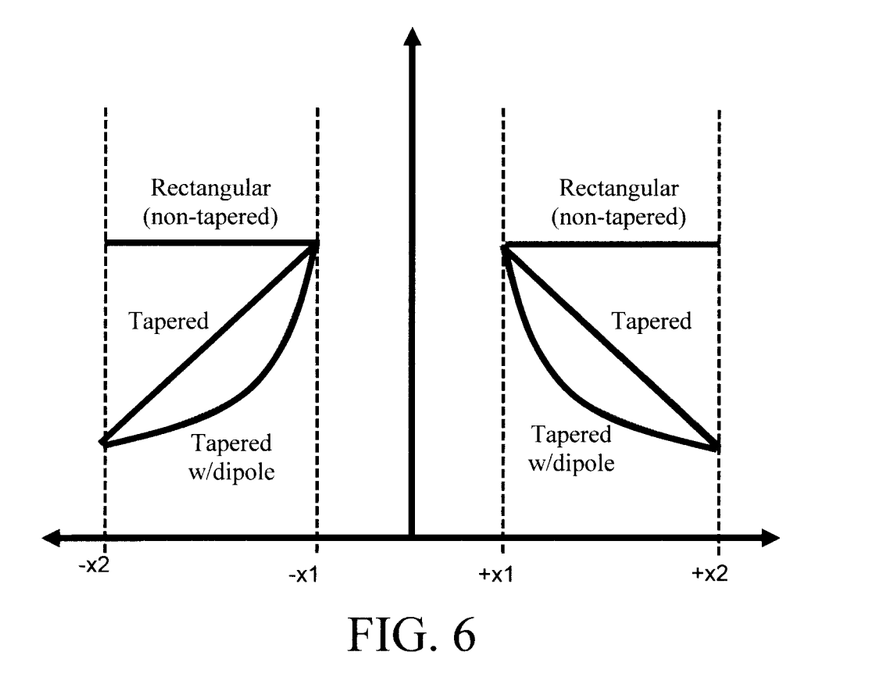
FIG. 6 is a diagram illustrating the flux distribution of an oxide resistive memory cell having a tapered design, an oxide resistive memory cell having a tapered design with an interfacial dipole and a rectangular, i.e., non-tapered, cell according to an embodiment of the present invention.
Figure 7:
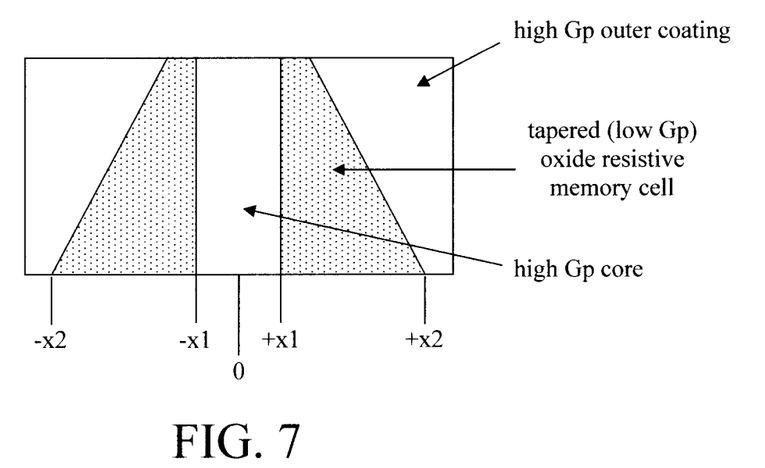
FIG. 7 is a schematic diagram of the present tapered oxide resistive memory cell design according to an embodiment of the present invention.

FIG. 6 is a diagram illustrating the flux distribution of an oxide resistive memory cell having a tapered design (see, e.g., FIG. 4) and an oxide resistive memory cell having a tapered design with an interfacial dipole (see, e.g., FIG. 5), as well as a rectangular, i.e., non-tapered, cell. As shown in FIG. 6, the interfacial dipole shifts the electric field of the tapered design toward the vertical sidewall (inner edges) of the oxide resistive memory cell. For reference, a corresponding schematic of the (low Gp) oxide resistive memory cell/high Gp core dielectric/high Gp oxide outer coating is provided in FIG. 7.

Figure 8:
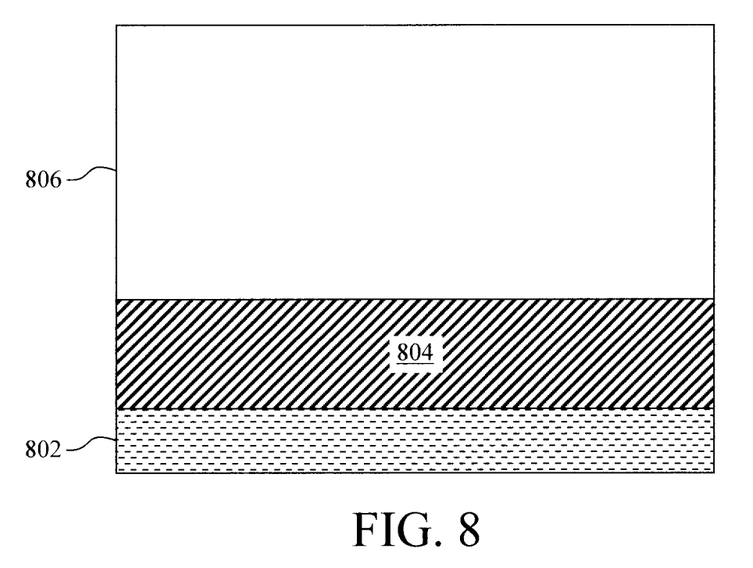
FIG. 8 is a cross-sectional diagram illustrating a bottom electrode having been formed on a substrate and a core dielectric having been deposited onto the substrate over the bottom electrode according to an embodiment of the present invention.

An exemplary methodology for forming the present ReRAM device is now described. As shown in FIG. 8, the process begins with the formation of a bottom electrode 804 on a substrate 802. According to an exemplary embodiment, substrate 802 includes a dielectric on which bottom electrode 804 is formed. Suitable dielectrics for substrate 802 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

According to an exemplary embodiment, bottom electrode 804 is formed by depositing a reactive metal onto substrate 802, and then using standard lithography and etching techniques to pattern the reactive metal into bottom electrode 804. A directional (anisotropic) etching process such as reactive ion etching (RIE) can be employed. As provided above, suitable reactive metals include, but are not limited to, TiN having a TiN ratio >1, Ti-containing alloys (such as TiN and/or TiW) and/or aluminum (Al)-containing alloys. (such as TiAlC).

A core dielectric 806 is then deposited onto substrate 802 over the bottom electrode 804. According to an exemplary embodiment, core dielectric 806 is a thermally conductive, high Gp dielectric. As provided above, suitable high Gp dielectric materials include, but are not limited to, $TiO_2$ and/or $AlO_2$.

Figure 9:
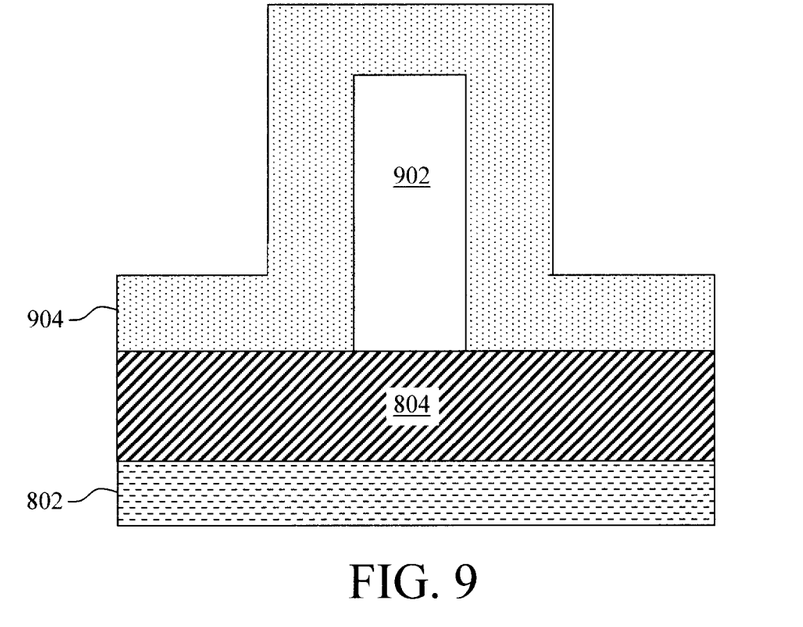
FIG. 9 is a cross-sectional diagram illustrating the core dielectric having been patterned into at least one thermally conductive, high group electronegativity (Gp) core dielectric mandrel on the bottom electrode, and a memory cell oxide layer having been deposited over the bottom electrode and the high Gp core dielectric according to an embodiment of the present invention.

The core dielectric 806 is then patterned into at least one thermally conductive, high Gp core dielectric 902 mandrel on bottom electrode 804. See FIG. 9. Standard lithography and etching techniques, e.g., using a directional (anisotropic) etching process such as RIE, can be employed for the mandrel patterning. A memory cell oxide layer 904 is then conformally deposited over the bottom electrode 804 and high Gp core dielectric 902. Suitable conformal deposition processes include, but are not limited to, chemical vapor deposition (CVD), atomic layer deposition (ALD) and physical vapor deposition (PVD). According to an exemplary embodiment, memory cell oxide layer 904 is formed from a low Gp dielectric. As provided above, suitable low Gp dielectric materials include, but are not limited to, $HfO_2$, $LaO_2$ and/or $SrTiO_3$.

Figure 10:
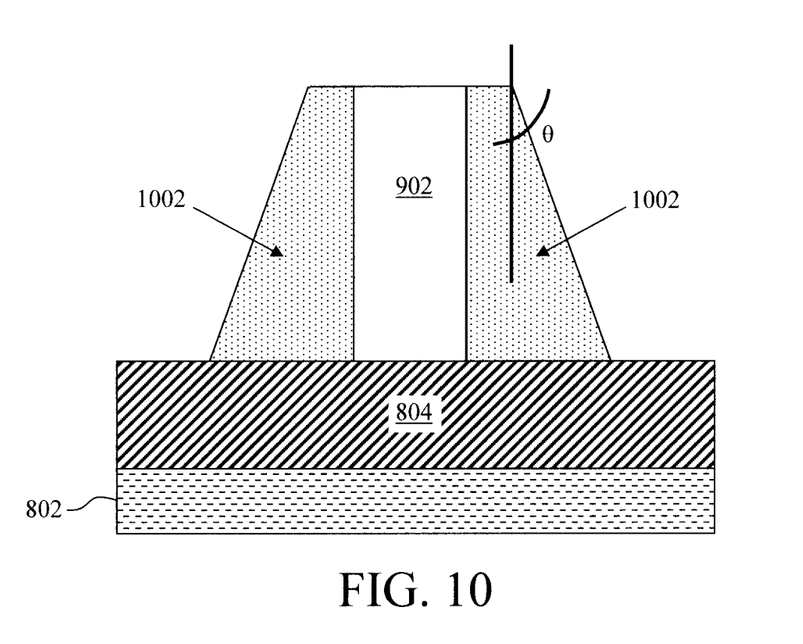
FIG. 10 is a cross-sectional diagram illustrating the memory cell oxide layer having been patterned into an oxide resistive memory cell along outer sidewalls of the high Gp core dielectric according to an embodiment of the present invention.

A directional (anisotropic) etching process such as RIE is then used to pattern the memory cell oxide layer 904 into an oxide resistive memory cell 1002 along outer sidewalls of the high Gp core dielectric 902. See FIG. 10. As shown in FIG. 10, oxide resistive memory cell 1002 has (vertical) inner edges adjacent to the high Gp core dielectric 902, and outer edges that are tapered at an angle θ. According to an exemplary embodiment, θ is from about 10° to about 80° and ranges therebetween, e.g., about 45°.

Figure 11:
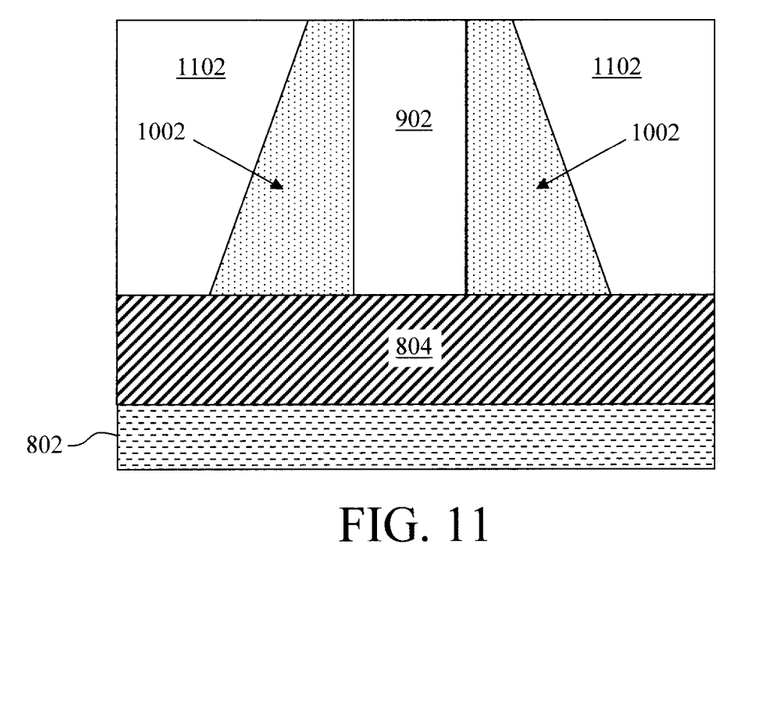
FIG. 11 is a cross-sectional diagram illustrating the oxide resistive memory cell having been buried in an outer coating dielectric, which is then planarized to form an outer coating adjacent to the outer edges of the oxide resistive memory cell according to an embodiment of the present invention.

The oxide resistive memory cell 1002 is then buried in an outer coating dielectric, which is then planarized using a process such as chemical-mechanical polishing (CMP) to form outer coating 1102 adjacent to the outer edges of the oxide resistive memory cell 1002. See FIG. 11. According to an exemplary embodiment, the outer coating dielectric is a high Gp dielectric. As provided above, suitable high Gp dielectric materials include, but are not limited to, $TiO_2$ and/or $AlO_2$. In one exemplary embodiment, the same high Gp dielectric is used for the outer coating dielectric as for the core dielectric (see above).

Figure 11A:
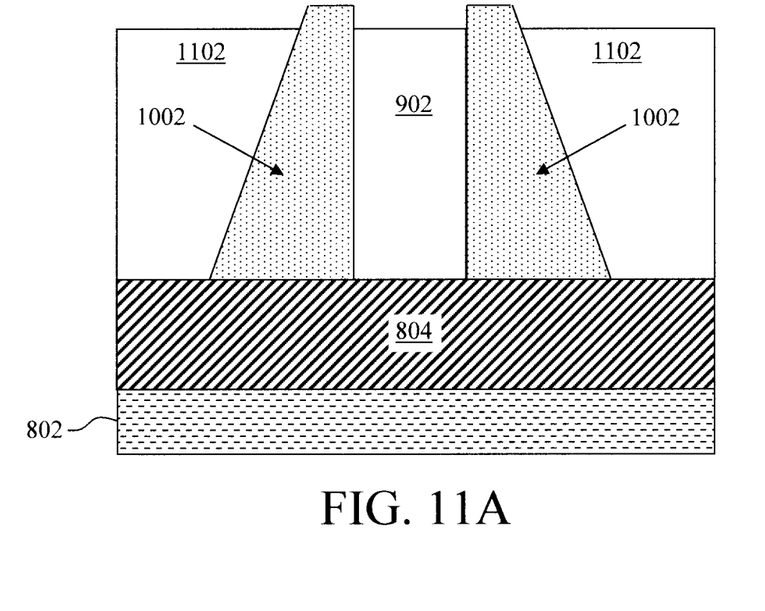
FIG. 11A is a cross-sectional diagram illustrating an optional recess of the high Gp core dielectric and high Gp outer coating having been performed selective to the oxide resistive memory cell such that top portions of the oxide resistive memory cell extends out from high Gp core dielectric and high Gp outer coating according to an embodiment of the present invention.

Optionally, as shown in FIG. 11A a recess of the high Gp core dielectric 902 and high Gp outer coating 1102 is performed selective to the oxide resistive memory cell 1002. As a result, top portions of the oxide resistive memory cell 1002 now extends out from high Gp core dielectric 902 and high Gp outer coating 1102 (compare, e.g., FIG. 11 where the top surfaces of the high Gp core dielectric 902, oxide resistive memory cell 1002, and high Gp outer coating 1102 are coplanar). As described above, this enables the top electrode (formed as described in detail below) to wrap around the top portions of oxide resistive memory cell 1002 extending out from the high Gp core dielectric 902/high Gp outer coating 1102. Doing so increases the contact area between oxide resistive memory cell and top electrode. By way of example only, etchants such as phosphoric acid ($H_3PO_4$), ammonium hydroxide ($NH_4OH$) and/or tetramethylammonium hydroxide (TMAH) can be used to etch high Gp dielectrics such as $Al_2O_3$ selective to low Gp dielectrics such as $HfO_2$.

Figure 12:
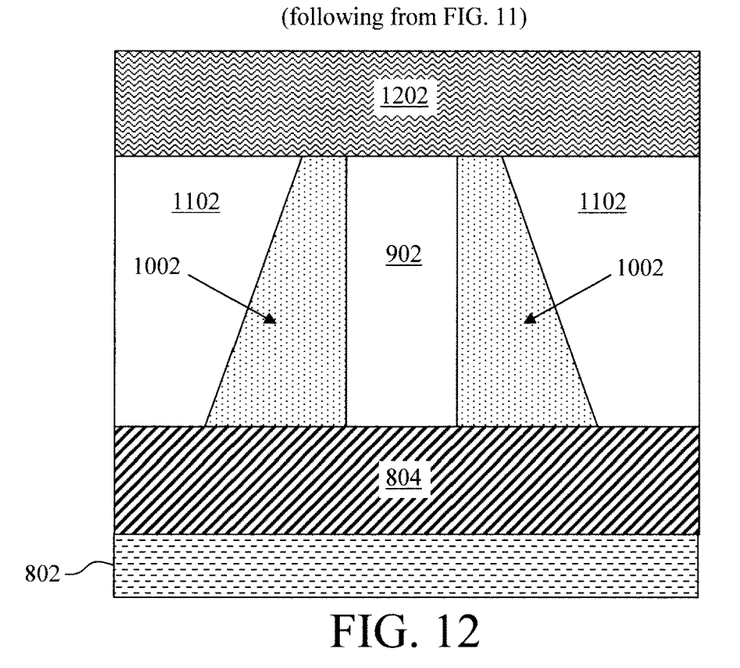
FIG. 12 is a cross-sectional diagram, which follows from FIG. 11, illustrating a top electrode having been formed on the high Gp core dielectric/oxide resistive memory cell/high Gp outer coating according to an embodiment of the present invention.

A top electrode 1202 is then formed on high Gp core dielectric 902/oxide resistive memory cell 1002/high Gp outer coating 1102. See FIG. 12. According to an exemplary embodiment, top electrode 1202 is formed by depositing an inert metal onto on high Gp core dielectric 902/oxide resistive memory cell 1002/high Gp outer coating 1102, and then using standard lithography and etching techniques such as RIE to pattern the inert metal into top electrode 1202. As provided above, suitable inert metals include, but are not limited to, TiN having a Ti/N ratio ≤1, TaN, W and/or noble metals such as Pt, Ir and/or Ru. FIG. 12 follows from the structure depicted in FIG. 11 where the top surfaces of the high Gp core dielectric 902, oxide resistive memory cell 1002, and high Gp outer coating 1102 are coplanar. As shown in FIG. 12, top electrode 1202 contacts the top of oxide resistive memory cell 1002.

Figure 12A:
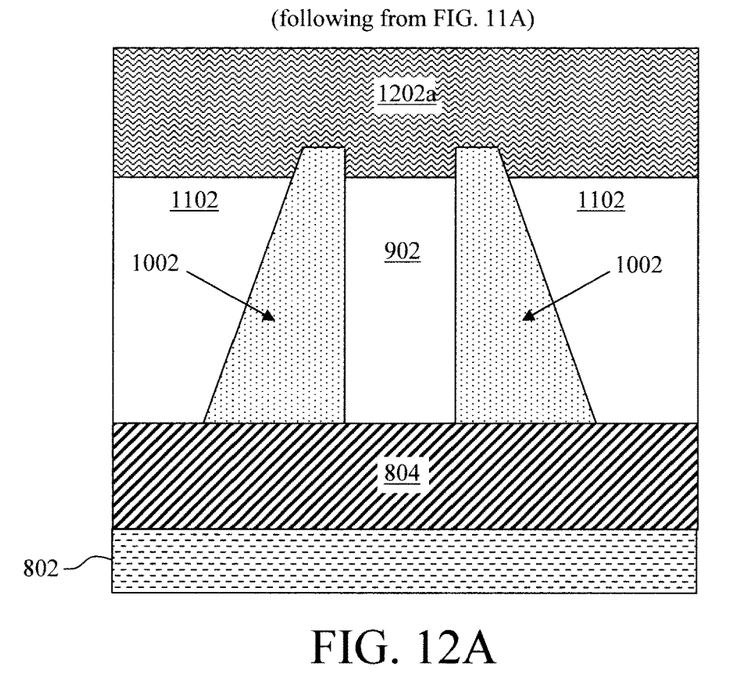
FIG. 12A is a cross-sectional diagram, which follows from FIG. 11A, illustrating a top electrode having been formed on the high Gp core dielectric/oxide resistive memory cell/high Gp outer coating that wraps around the top portions of oxide resistive memory cell extending out from the high Gp core dielectric/high Gp outer coating according to an embodiment of the present invention.

However, if the optional recess of the high Gp core dielectric 902 and high Gp outer coating 1102 selective to the oxide resistive memory cell 1002 has been performed (see FIG. 11A, described above), then top portions of the oxide resistive memory cell 1002 extend out from the high Gp core dielectric 902/high Gp outer coating 1102. As such, a top electrode 1202a formed by the above-described process wraps around the top portions of oxide resistive memory cell 1002 extending out from the high Gp core dielectric 902/high Gp outer coating 1102. See FIG. 12A (which follows from FIG. 11A). Doing so increases the contact area between oxide resistive memory cell and top electrode.

Thus, based on the above-described process, the present ReRAM device generally includes a (reactive metal) bottom electrode, a (high Gp) core dielectric that is thermally conductive disposed on the bottom electrode, a (low Gp) oxide resistive memory cell disposed along outer sidewalls of the core dielectric having inner (e.g., vertical) edges adjacent to the core dielectric, and outer edges that are tapered, a (high Gp) outer coating disposed adjacent to the outer edges of the oxide resistive memory cell, and an (inert metal) top electrode disposed on the core dielectric, the oxide resistive memory cell, and the outer coating. See, for example, ReRAM device 100 of FIG. 1. Optionally, an exposed top portion of the oxide resistive memory cell can extend out from the core dielectric and the outer coating, whereby the top electrode wraps around the exposed top portion of the oxide resistive memory cell. See, for example, ReRAM device 200 of FIG. 2.

Figure 13:
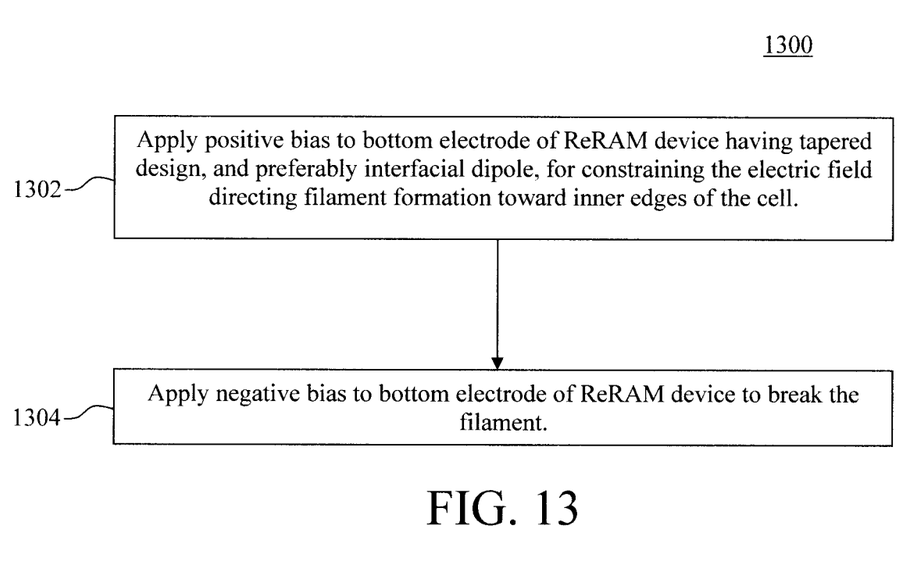
FIG. 13 is a diagram illustrating an exemplary methodology for operating the present ReRAM device according to an embodiment of the present invention.

FIG. 13 is a diagram illustrating an exemplary methodology 1300 for operating the present ReRAM device. For illustrative purposes only, methodology 1300 is described by way of reference to ReRAM device 100 of FIG. 1 and ReRAM device 200 of FIG. 2. However, the steps of methodology 1300 are applicable to any of the ReRAM device designs described herein.

In step 1302, during a SET operation a positive bias is applied to the bottom electrode 110/210 of ReRAM device 100/200, respectively. This positive applied bias causes ions from the bottom electrode 110/210 to migrate through oxide resistive memory cell 102/202 toward the top electrode 108/208 forming electrically-conductive filaments in oxide resistive memory cell 102/202, thereby decreasing the cell resistance in ReRAM device 100/200, respectively.

As provided above, the tapered design of oxide resistive memory cell 102/202 geometrically constrains the highest electric fields toward the inner edge of the oxide resistive memory cell 102/202, thus directing filament formation toward the inner edges of the oxide resistive memory cell. Further, employing a low Gp dielectric for the oxide resistive memory cell 102/202 as opposed to high Gp dielectrics for the core dielectric 104/204 and outer coating 106/206 of ReRAM device 100/200, respectively, introduces an interfacial dipole at the inner and outer edges of the oxide resistive memory cell 102/202 further constraining the highest field regions toward the inner edges. Directing filament formation toward the inner edges of the oxide resistive memory cell advantageously places more filaments closer to the high Gp core which has higher thermal conductivity than the (low Gp) dielectric of the oxide resistive memory cell which reduces Joule heating, and produces less abrupt SET programming.

In step 1304, during a RESET operation a reverse/negative bias is applied to the bottom electrode 110/210 of ReRAM device 100/200, respectively. This negative applied bias causes the electrically-conductive filaments in oxide resistive memory cell 102/202 to break or rupture, thereby increasing the cell resistance in ReRAM device 100/200, respectively.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A resistive random-access memory (ReRAM) device, comprising:
   a bottom electrode;
   a core dielectric that is thermally conductive disposed on the bottom electrode;
   an oxide resistive memory cell disposed along outer sidewalls of the core dielectric, wherein the oxide resistive memory cell has inner edges adjacent to the core dielectric, and outer edges that are tapered;
   an outer coating disposed adjacent to the outer edges of the oxide resistive memory cell; and
   a top electrode disposed on the core dielectric, the oxide resistive memory cell, and the outer coating.

2. The ReRAM device of claim 1, wherein the core dielectric and the outer coating each comprises a high group electronegativity (Gp) dielectric material, and wherein the oxide resistive memory cell comprises a low Gp dielectric material.

3. The ReRAM device of claim 2, wherein the high Gp dielectric material is selected from the group consisting of: titanium oxide ($TiO_2$), aluminum oxide ($AlO_2$), and combinations thereof.

4. The ReRAM device of claim 2, wherein the low Gp dielectric material is selected from the group consisting of: hafnium oxide ($HfO_2$), lanthanum oxide ($LaO_2$), strontium titanate ($SrTiO_3$), and combinations thereof.

5. The ReRAM device of claim 2, wherein the core dielectric and the outer coating are formed from a same high Gp dielectric material.

6. The ReRAM device of claim 1, wherein the outer edges of the oxide resistive memory cell are tapered at an angle θ of from about 10° to about 80° and ranges therebetween.

7. The ReRAM device of claim 1, wherein the inner edges of the oxide resistive memory cell are vertical.

8. The ReRAM device of claim 1, wherein the bottom electrode comprises a reactive metal selected from the group consisting of: titanium nitride (TiN) having a Ti/N ratio of greater than 1, Ti-containing alloys, aluminum (Al)-containing alloys, and combinations thereof.

9. The ReRAM device of claim 1, wherein the top electrode comprises an inert metal selected from the group consisting of: TiN having a Ti/N ratio of less than or equal to 1, tantalum nitride (TaN), tungsten (W), platinum (Pt), iridium (Ir), ruthenium (Ru), and combinations thereof.

10. The ReRAM device of claim 1, wherein an exposed top portion of the oxide resistive memory cell extends out from the core dielectric and the outer coating, and wherein the top electrode wraps around the exposed top portion of the oxide resistive memory cell.

11. A method of operating a ReRAM device, the method comprising the steps of:
providing the ReRAM device comprising: a bottom electrode, a core dielectric that is thermally conductive disposed on the bottom electrode; an oxide resistive memory cell disposed along outer sidewalls of the core dielectric, wherein the oxide resistive memory cell has inner edges adjacent to the core dielectric, and outer edges that are tapered, an outer coating disposed adjacent to the outer edges of the oxide resistive memory cell, and a top electrode disposed on the core dielectric, the oxide resistive memory cell, and the outer coating;
applying a positive bias to the bottom electrode to form filaments in the oxide resistive memory cell, whereby the outer edges of the oxide resistive memory cell that are tapered geometrically constrain formation of the filaments toward the inner edges of the oxide resistive memory cell; and
applying a negative bias to the bottom electrode to break the filaments.

12. The method of claim 11, wherein the core dielectric and the outer coating each comprises a high Gp dielectric material selected from the group consisting of: $TiO_2$, $AlO_2$, and combinations thereof, wherein the oxide resistive memory cell comprises a low Gp dielectric material selected from the group consisting of: $HfO_2$, $LaO_2$, $SrTiO_3$, and combinations thereof, and wherein the method further comprises the step of:
introducing an interfacial dipole at the inner edges and the outer edges of the oxide resistive memory cell.

13. The method of claim 11, wherein an exposed top portion of the oxide resistive memory cell extends out from the core dielectric and the outer coating, and wherein the top electrode wraps around the exposed top portion of the oxide resistive memory cell.

* * * * *